US012656390B2

(12) United States Patent
Kumar et al.

(10) Patent No.: US 12,656,390 B2
(45) Date of Patent: Jun. 16, 2026

(54) ACTIVE BRIDGE-BASED CHIPLET INTERCONNECT ARCHITECTURE WITH SHORT-TO-LONG CONVERTER CIRCUIT

(71) Applicant: International Business Machines Corporation, Armonk, NY (US)

(72) Inventors: Arvind Kumar, Chappaqua, NY (US); Ramachandra Divakaruni, Ossining, NY (US); Mukta Ghate Farooq, Hopewell Jct, NY (US); John W Golz, Hopewell Jct, NY (US); Jin Ping Han, Yorktown Heights, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 17/954,107

(22) Filed: Sep. 27, 2022

(65) Prior Publication Data

US 2024/0103065 A1     Mar. 28, 2024

(51) Int. Cl.
G01R 31/28     (2006.01)
G01R 31/3187     (2006.01)
G06F 13/40     (2006.01)

(52) U.S. Cl.
CPC ..... G01R 31/2843 (2013.01); G01R 31/3187 (2013.01); G06F 13/4027 (2013.01); G06F 13/4068 (2013.01)

(58) Field of Classification Search
CPC ........... G01R 31/2843; G01R 31/3187; G01R 31/2896; G01R 31/31717;
(Continued)

(56) References Cited

U.S. PATENT DOCUMENTS 6,425,109 B1 *     7/2002     Choukalos .............. G06F 30/30
                                                716/119
6,966,042 B2 *     11/2005     Carr ................. G01R 31/31723
                                                716/108
(Continued)

OTHER PUBLICATIONS

Walker J. Turner et al., "Ground-Referenced Signaling for Intra-Chip and Short-Reach Chip-to-Chip Interconnects." 2018 IEEE Custom Integrated Circuits Conference (CICC) Apr. 8, 2018 (pp. 1-8). IEEE.

(Continued)

*Primary Examiner* — Vinh P Nguyen
(74) *Attorney, Agent, or Firm* — Seed Intellectual Property Law Group LLP

(57) ABSTRACT

A semiconductor integrated circuit device includes: an active bridge; a first chiplet and a second chiplet mounted onto the active bridge; and a short-to-long converter circuit (SLCC) that has analog and digital portions. The active bridge includes at least the analog portion of the SLCC, which is electrically connected to at least the first chiplet; and a short-reach physical layer that electrically connects the first chiplet and the second chiplet. The first chiplet includes a first logic core; a first chiplet interface that is electrically connected between the first logic core and the SLCC; and a second chiplet interface that is electrically connected between the first logic core and the second chiplet. The second chiplet includes a second logic core; and a third chiplet interface that is electrically connected between the second logic core and the second chiplet interface. The active bridge also can include a built-in-self-test (BIST) circuit.

20 Claims, 8 Drawing Sheets

(58) Field of Classification Search
CPC ...... G01R 31/318513; G01R 31/31855; G06F
13/4027; G06F 13/4068; G06F 11/24;
G06F 11/22; G06F 11/3457; H01L
25/0657; H01L 22/10; H01L 25/0652;
H01L 25/0655; H01L 22/34; H01L
2224/83908; H01L 2224/95; H01L 23/538
See application file for complete search history.

(56) References Cited

U.S. PATENT DOCUMENTS

| | | | |
|---|---|---|---|
| 9,368,450 B1 * | 6/2016 | Gu | ...................... H01L 23/5385 |
| 9,754,890 B2 | 9/2017 | Deshpande | |
| 9,875,969 B2 | 1/2018 | Braunisch | |
| 10,483,156 B2 | 11/2019 | Leobandung | |
| 10,510,669 B2 | 12/2019 | Braunisch | |
| 10,950,550 B2 | 3/2021 | Qian | |
| 11,133,259 B2 | 9/2021 | Rubin | |
| 11,164,817 B2 * | 11/2021 | Rubin | ................. H01L 23/5385 |
| 11,217,535 B2 | 1/2022 | Elsherbini | |

| | | | |
|---|---|---|---|
| 2021/0134724 A1 | 5/2021 | Rubin |
| 2021/0384130 A1 | 12/2021 | Cheah |
| 2022/0028848 A1 | 1/2022 | Baek |

OTHER PUBLICATIONS

Synposys, Inc. "Synopsis Die-to-Die IP Solutions." https://www.synopsys.com/designware-ip/interface-ip/die-to-die.html, retrieved Aug. 5, 2022. pp. 1-10.
EDN, "Essential principles for practical analog BIST." https://www.edn.com/essential-principles-for-practical-analog-bist/. Nov. 2010. pp. 1-17.
Brian Harrington, "Bist for Analog Weenies." AnalogDialogue, retrieved Aug. 5, 2022. pp. 1-4.
Antonios Pavlidis et al., "SymBIST: Symmetry-Based Analog and Mixed-Signal Built-In Self-Test for Functional Safety." https://hal.science/hal-03171195, submitted Mar. 16, 2021. pp. 1-15.
Chuck Stroud, "A Built-In Self-Test Approach for Analog Circuits in Mixed-Signal Systems." Dept. of Electrical & Computer Engineering, Auburn University. Sep. 2004. pp. 1-31.

* cited by examiner

800

900

1100

1102 generate a parallel short-reach signal 1104 serialize the short-reach signal 1106 transmit the short-reach signal 1108 condition the serialized signal 1110 transmit the long-reach signal

ACTIVE BRIDGE-BASED CHIPLET INTERCONNECT ARCHITECTURE WITH SHORT-TO-LONG CONVERTER CIRCUIT

BACKGROUND

The present invention relates to the electrical, electronic, and computer arts, and more specifically, to integrated circuits and their packaging.

As a recurring theme in the production of computing devices, such as those implemented using integrated circuits, various functions of an entire circuit may be split among subcircuits formed on separate chiplets, which then are mounted to a module. A module is a second-level package between a first-level package and either the next level of package if it exists, or a printed circuit board or card (referred to herein as a "substrate"). Communication among the chiplets may occur through the module alone, or through a bridge that is mounted between the module and the chiplets. Sometimes multiple modules are connected in communication with each other. A typical routing of communication is chiplet-to-module-to-module-to-chiplet. Chiplet-to-chiplet communication between chiplets mounted to the same module uses "short-reach" physical and logical layers (the physical layer is the actual physical connection between chiplets, while the logical layer is the protocol used for communication). Chiplet-to-chiplet communication between chiplets mounted to different modules uses "long-reach" physical and logical layers that go through the substrate. Chiplets may contain short-reach physical layers for communicating with other chiplets in the module, while at least one chiplet on the module contains a long-reach physical module for communication off the module.

SUMMARY

Principles of the invention provide techniques for an active bridge for chiplet and module inter-communication.

According to one aspect, an exemplary semiconductor integrated circuit device includes: an active bridge; a first chiplet mounted onto the active bridge; a second chiplet mounted onto the active bridge; and a short-to-long converter circuit that includes an analog portion and a digital portion. The active bridge includes at least the analog portion of the short-to-long converter circuit, which is electrically connected to at least the first chiplet; and a short-reach physical layer that electrically connects the first chiplet and the second chiplet. The first chiplet includes a first logic core; a first chiplet interface that is electrically connected between the first logic core and the short-to-long converter circuit; and a second chiplet interface that is electrically connected between the first logic core and the second chiplet. The second chiplet includes a second logic core; and a third chiplet interface that is electrically connected between the second logic core and the second chiplet interface.

According to another aspect, an exemplary semiconductor integrated circuit device includes an active bridge; a first chiplet mounted onto the active bridge; a second chiplet mounted onto the active bridge; and a short-to-long converter circuit that includes an analog portion and a digital portion. The active bridge includes at least the analog portion of the short-to-long converter circuit, which is electrically connected to at least the first chiplet; a short-reach physical layer that electrically connects the first chiplet and the second chiplet; and a built-in-self-test (BIST)

circuit that is connected in communication with at least the analog portion of the short-to-long converter circuit.

Another aspect provides a method that includes, in a semiconductor integrated circuit device that includes two chiplets, a module, a substrate, another module, and an active bridge that is connected between the two chiplets and the module, generating a parallel short-reach signal in one of the chiplets; serializing the short-reach signal; transmitting the short-reach signal from the one of the chiplets to the active bridge; conditioning the serialized signal as a long-reach signal; and transmitting the long-reach signal from the active bridge through the module and the substrate to the other module. In certain embodiments, the signal could be transmitted between disparate substrates as well, e.g., via a cable or wirelessly.

In view of the foregoing, techniques of the present invention can provide substantial beneficial technical effects. For example, one or more embodiments provide one or more of:

Simplicity of designing and building chiplets that do not have to embody a long-reach physical layer.

Enhanced utilization of area on chiplets with small feature sizes, by building non-scaling analog features in an active bridge that is built at a larger process node.

Enhanced utilization of area on chiplets with small feature sizes, by unifying a long-reach physical layer for multiple chiplets onto a single active bridge.

Enhanced efficiency of inter-chiplet and inter-module communications by providing, within an active bridge, a switch that can be controlled by a chiplet to select between short-reach or long-reach physical layers depending on whether the chiplet is communicating with an adjacent chiplet on the same module or with a distant chiplet on a different module.

Enhanced reliability of chiplet-bridge-and-module assemblies, by providing for built-in-self-test (BIST) of an active bridge before assembly with the chiplets and module.

Enhanced area efficiency of chiplets by using smaller ESD diodes on chiplet(s) and a larger ESD diode on the active bridge.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
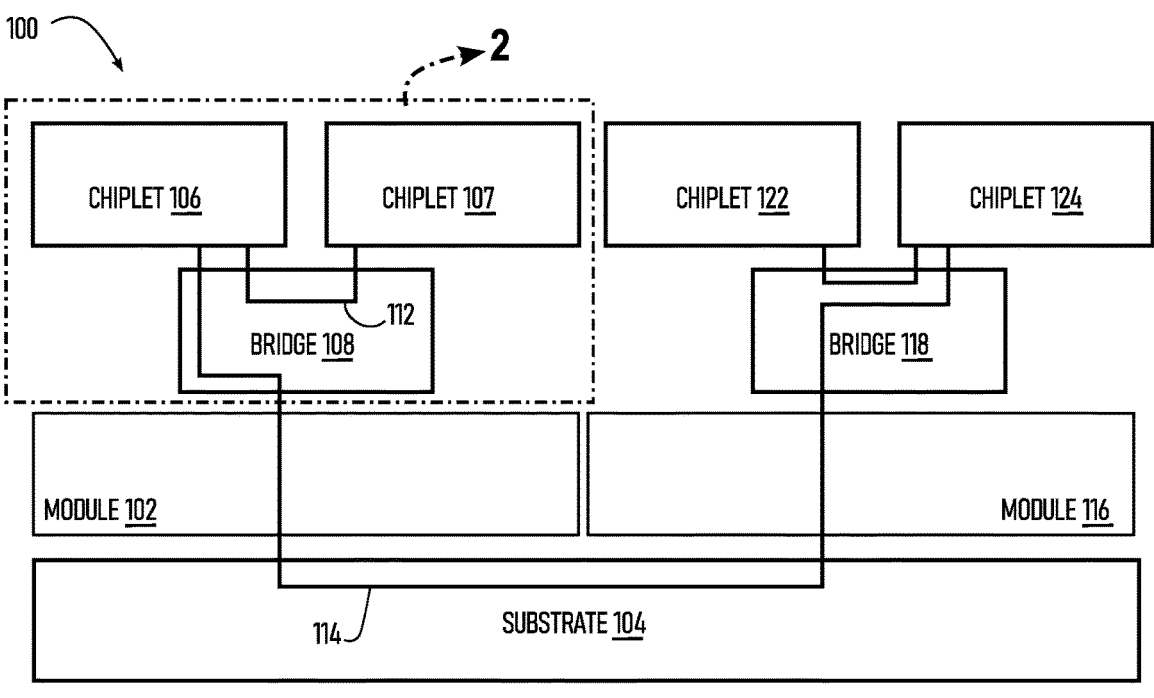
FIG. 1 depicts a multi-module integrated circuit assembly that includes active bridges, according to exemplary embodiments.

FIG. 1 depicts a multi-module integrated circuit assembly 100 that includes active bridges 108, 118, according to exemplary embodiments. The bridges 108, 118 are elevated active logic-containing bridges that are above the laminate surfaces of modules 102, 116. The assembly 100 also includes the modules 102, 116, which are mounted to a substrate 104 (e.g., a printed circuit board). Chiplets 106, 107, 122, 124 are attached in communication with the modules 102, 116 via the active bridges 108, 118. The active bridges 108, 118 include short-reach physical layers (PHY) 112 and the bridges 108, 118, modules 102, 116 and substrate 104 incorporate a long-reach PHY 114. Further details of the chiplets and bridges are shown in FIG. 2 through FIG. 6.

Figure 2:
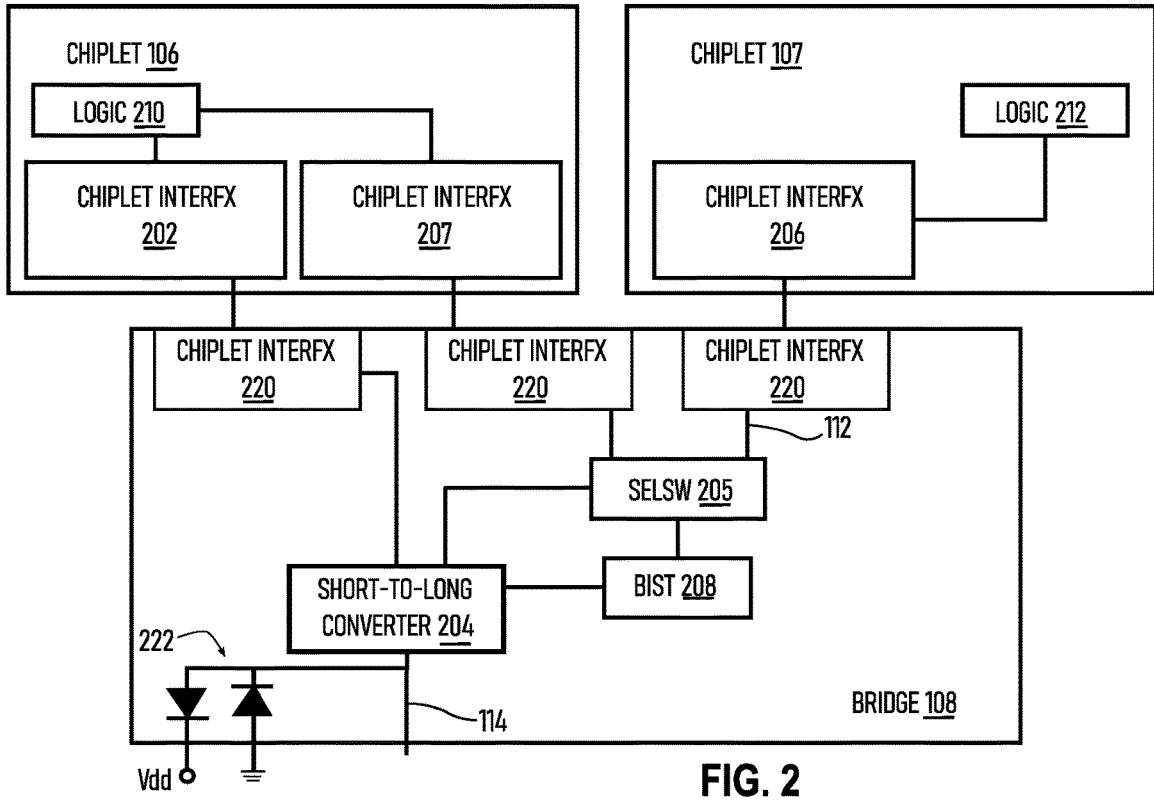
FIG. 2 is a detail of FIG. 1, and depicts chiplets that are assembled to an active bridge, according to exemplary embodiments.

FIG. 2 is a detail of FIG. 1, and depicts chiplets 106, 107 that are assembled to an active bridge 108, according to exemplary embodiments. Each chiplet includes two-way chiplet interfaces 202, 206, 207, which support inter-chiplet and chiplet-to-bridge communications. The active bridge 108 also includes chiplet interfaces 220, which enable communication between the chiplets and the bridge.

In conventional designs, each of the chiplet interfaces 202, 206, 207 might include complete short-reach and long-reach physical layers (PHY), i.e., serializer/deserializer (SerDes) circuitry for short-reach and long-reach communications, as well as analog signal conditioners for the long-reach communications. By contrast, in one or more embodiments, at least an analog portion of the long-reach PHY 114 is disposed in the active bridge 108. Indeed, FIG. 2 shows the entire short-to-long converter circuit 204 being embodied in the bridge 108. A chiplet interface 203 in the active bridge 108 is directly connected in communication with a chiplet interface 202 in one of the chiplets 106, and is connected via a selector switch 205 to another chiplet interface 206 in another of the chiplets 107. Thus, the chiplet interfaces 206, 207 can handle digital short-reach communications between logic cores 210, 212 of chiplets 106, 107 that share the module 102, while the active bridge 108 embodies the analog devices required for long-reach communication. Due to electromagnetic requirements, the analog devices typically do not scale in the same manner that digital devices can be scaled. Advantageously, putting at least the analog portion of the long-reach PHY 114 in the active bridge 108 enables the analog devices to be fabricated in a larger process node that is used for the active bridge, thereby freeing up space on the chiplets for additional digital devices to be fabricated in a smaller process node that is used for the chiplets. In this context, "process node" refers to a minimum feature dimension of a particular chip fabrication process, e.g., 20 nm, 3 nm, and others now known or later developed.

In one or more embodiments, as shown in FIG. 2, the active bridge 108 embodies not only the analog portion but also the digital portion of the short-to-long converter circuit

204. The digital portion of the short-to-long converter circuit 204 includes, for example, a serializer/deserializer (SerDes) of the type formerly disposed in chiplets of prior art modules. Advantageously, SerDes functionality can be implemented efficiently in a larger process node (as used for the active bridge 108) compared to the smaller process node that is more efficiently allocated to logic devices and memory on the chiplets 106 and 107. In a face up configuration of the active bridge, through-silicon vias (TSVs) carry the long-reach PHY 114 from the short-to-long converter circuit 204 to the module 102. The ordinary skilled worker is familiar with modes for implementation of through-silicon vias, and, given the teachings herein, can employ known TSV techniques to implement one or more embodiments.

In one or more embodiments, the selector switch 205 enables communication from a chiplet 106 or 107 via the active bridge 108 to a switchable destination (either short-reach to another chiplet 106 or 107 on the same module 102, or long-reach to another chiplet on a different module, e.g., chiplet 124 on module 116). When the selector switch 205 is involved, short-reach communication goes along short-reach PHY 112 from one chiplet interface 206 through the selector switch 205 to another chiplet interface 207, whereas long-reach communication goes from the chiplet interface 206 or 207 through the chiplet interface 220 to the selector switch 205 and then to the chiplet interface 220 or to the short-to-long converter circuit 204.

The term selector "switch" is, essentially, a simplified terminology. In one or more embodiments, the selector switch 205 can involve relatively complex circuitry, as it may direct parallel or serialized data streams. An exemplary selector switch 205 is described below with reference to FIG. 4 and its operation is described with reference to FIG. 7.

The active bridge 108 also includes a built-in-self-test circuit (BIST) 208. The BIST 208 is connected in communication with one or more of the chiplet interface 220, the short-to-long converter circuit 204, and the selector switch 205. The BIST 208 can be used before mounting the bridge 108 to the module 102, in order to detect any faults in the bridge so that it can be discarded and replaced with a non-faulty bridge. FIG. 6 depicts an exemplary BIST 208, and its operation is further discussed with reference to FIG. 5 and FIG. 8.

FIG. 2 also depicts an electrostatic discharge (ESD) protection diode 222, which is connected from the short-to-long converter 204 to a ground off the active bridge. As will be understood by the ordinary skilled worker, ESD diodes often are connected from inputs of particular circuits on a large component (e.g., a chiplet or a bridge) to power or to ground (as shown) on another large component (e.g., a bridge or module). Such diodes protect against ESD that might be generated by human or mechanical handling of the components. Advantageously, putting the long-reach portion of the communications circuitry on the active bridge means that the associated ESD diode 222 can be fabricated in the relatively large process node of the bridge rather than in the smaller, more advanced process node of the chiplets. Since analog components, such as the ESD diode 222, do not scale to process, it is helpful to form such components in larger processes.

Although FIG. 2 shows the active bridge 108 and exemplary chiplets 106, 107 for only one module 102, the assembly 100 can optionally include many modules and each module can have many chiplets and multiple active bridges.

Figure 3:
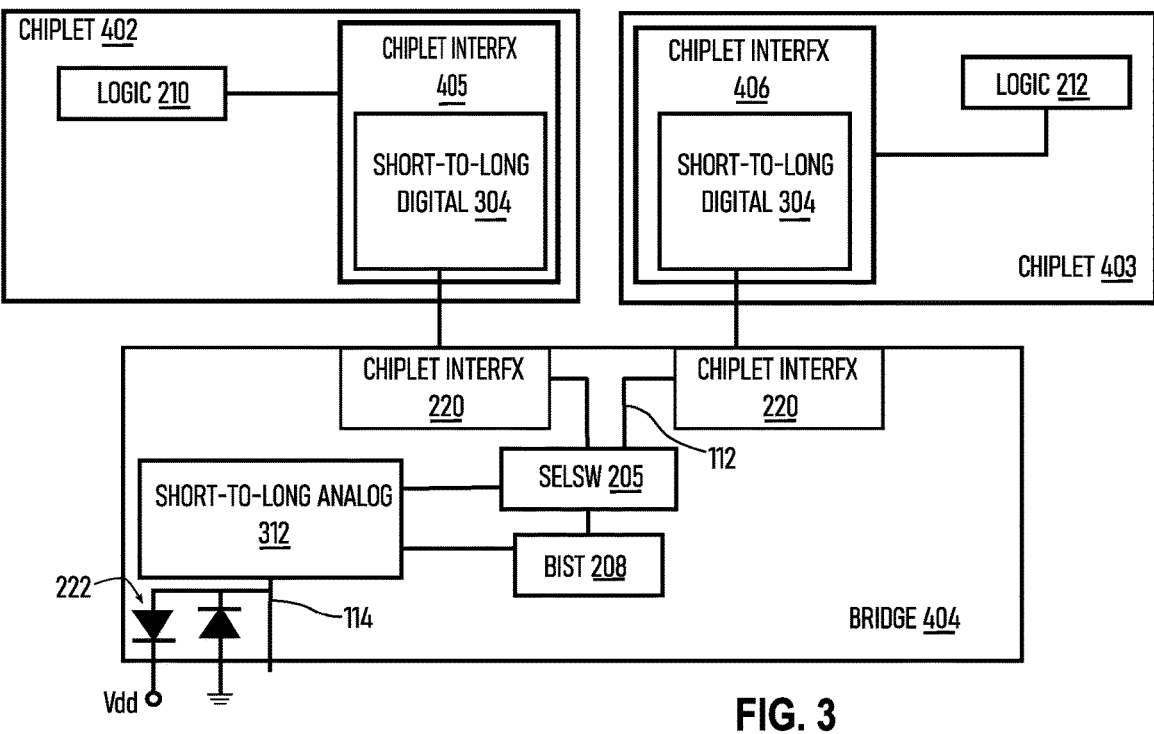
FIG. 3 depicts chiplets that are assembled to an active bridge, according to exemplary embodiments.

FIG. 3 depicts chiplets 402, 403 that are mounted onto an active bridge 404. With reference to FIG. 3, components that are similar to those of FIG. 2 and/or FIG. 3 are numbered alike and only are discussed herein to the extent that they differ from those of FIG. 2 and/or FIG. 3. Each chiplet 402, 403 embodies a respective chiplet interface 405, 406. Each chiplet interface 405, 406 includes the digital portion 304 of a short-to-long converter circuit. As such, a selector switch 205 (in the active bridge 404) can route communications between chiplets or from either chiplet to the analog portion 312 of the short-to-long converter circuit. As in other embodiments, the active bridge 404 embodies both a short-reach PHY 112 and a portion of a long-reach PHY 114. The active bridge 404 includes the BIST 208.

Figure 4:
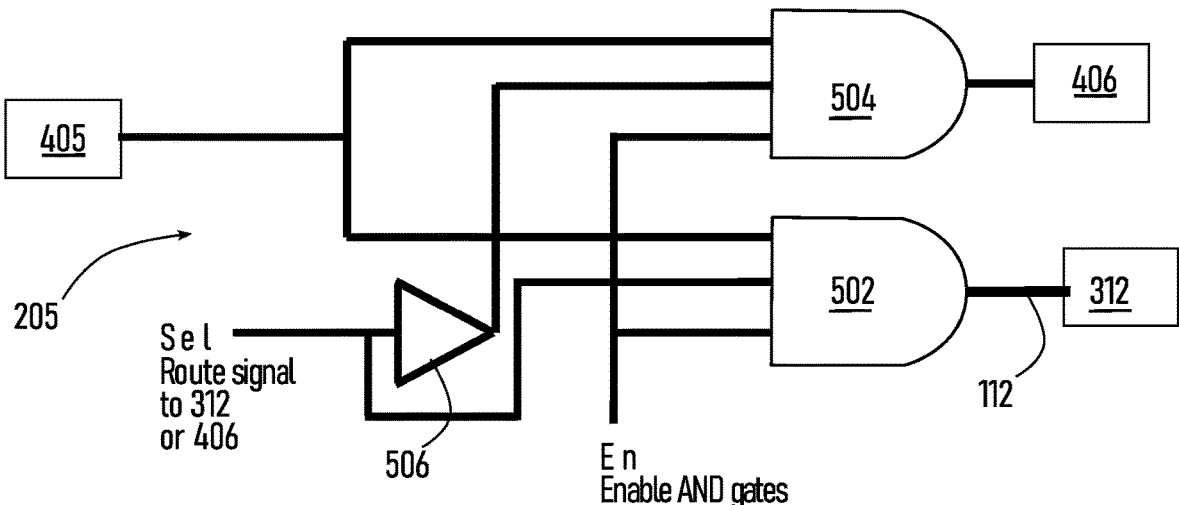
FIG. 4 depicts details of a communications selector switch that is usable in the active bridge or chiplets shown in FIG. 1 through FIG. 3.

FIG. 4 depicts details of the communications selector switch 205 that is usable in the active bridge or chiplets shown in FIG. 1 through FIG. 3. As an example, the selector switch 205 is shown connected between chiplet interfaces 405, 406 and short-to-long analog converter 312, as in the embodiment that is shown in FIG. 3; however, principles of the operation of the selector switch 205 equally are applicable to other embodiments. The selector switch 205 includes three-input AND gates 502, 504 as well as an inverter (NOT gate) 506. The switch 205 can be implemented, for example, using a simple demultiplexer.

Figure 7:
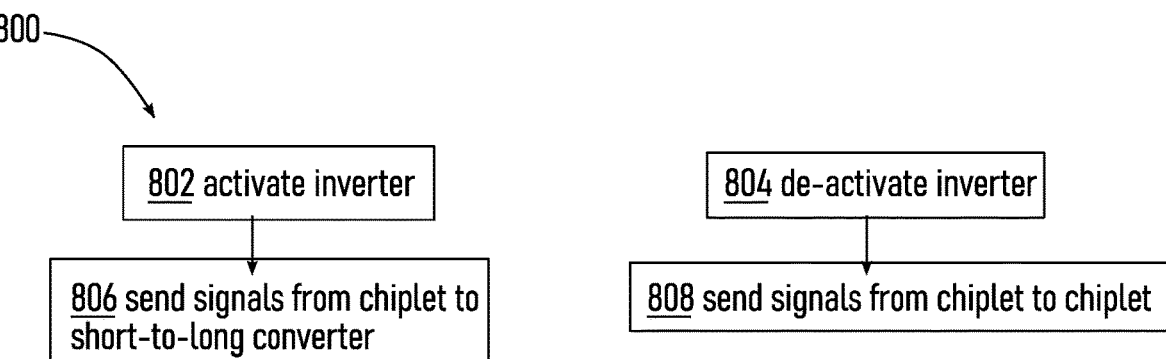
FIG. 7 depicts, in a flowchart, a method of operation of the selector switch that is shown in FIG. 4.

In operation, according to a method 800 as shown in FIG. 7, the inverter 506 can be activated, at 802, to send a low signal to AND gate 504 and a high signal to AND gate 502; or, it can be deactivated, at 804, to send a high signal to AND gate 504 and a low signal to AND gate 502. Thus, when the inverter 506 is activated, then at 806, the AND gate 502 sends signals from chiplet interface 405 to short-to-long analog converter 312, whereas when the inverter 506 is deactivated, then at 808, the AND gate 504 sends signals from chiplet interface 405 to chiplet interface 406. The selector switch 205 similarly includes AND gates (not shown) from chiplet interface 406 to chiplet interface 405 and to short-to-long analog converter 312, as well as AND gates (not shown) from short-to-long analog converter 312 to chiplet interface 405 and to chiplet interface 406.

Figure 5:
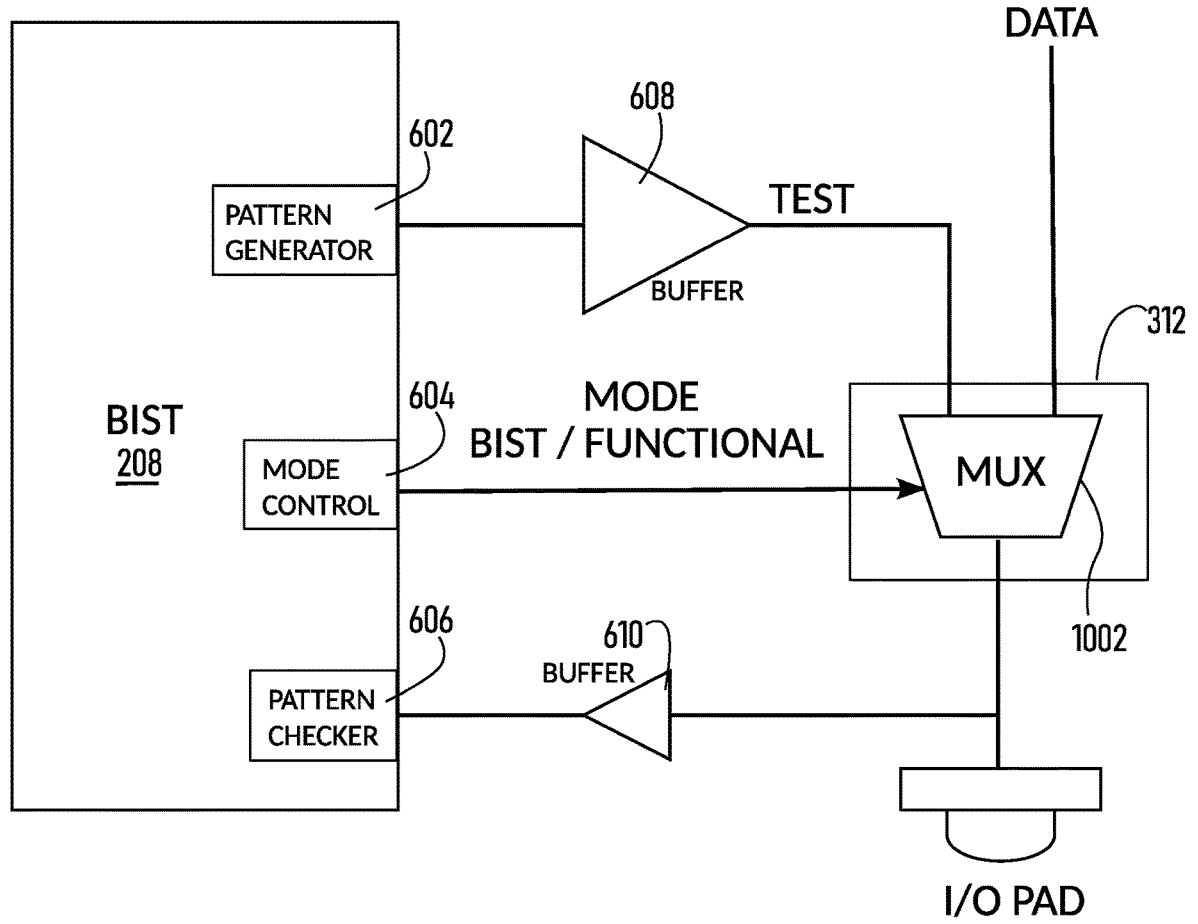
FIG. 5 depicts a built-in-self-test (BIST) circuit that is usable in any of the active bridges that are shown in FIG. 1 through FIG. 3.
Figure 6:
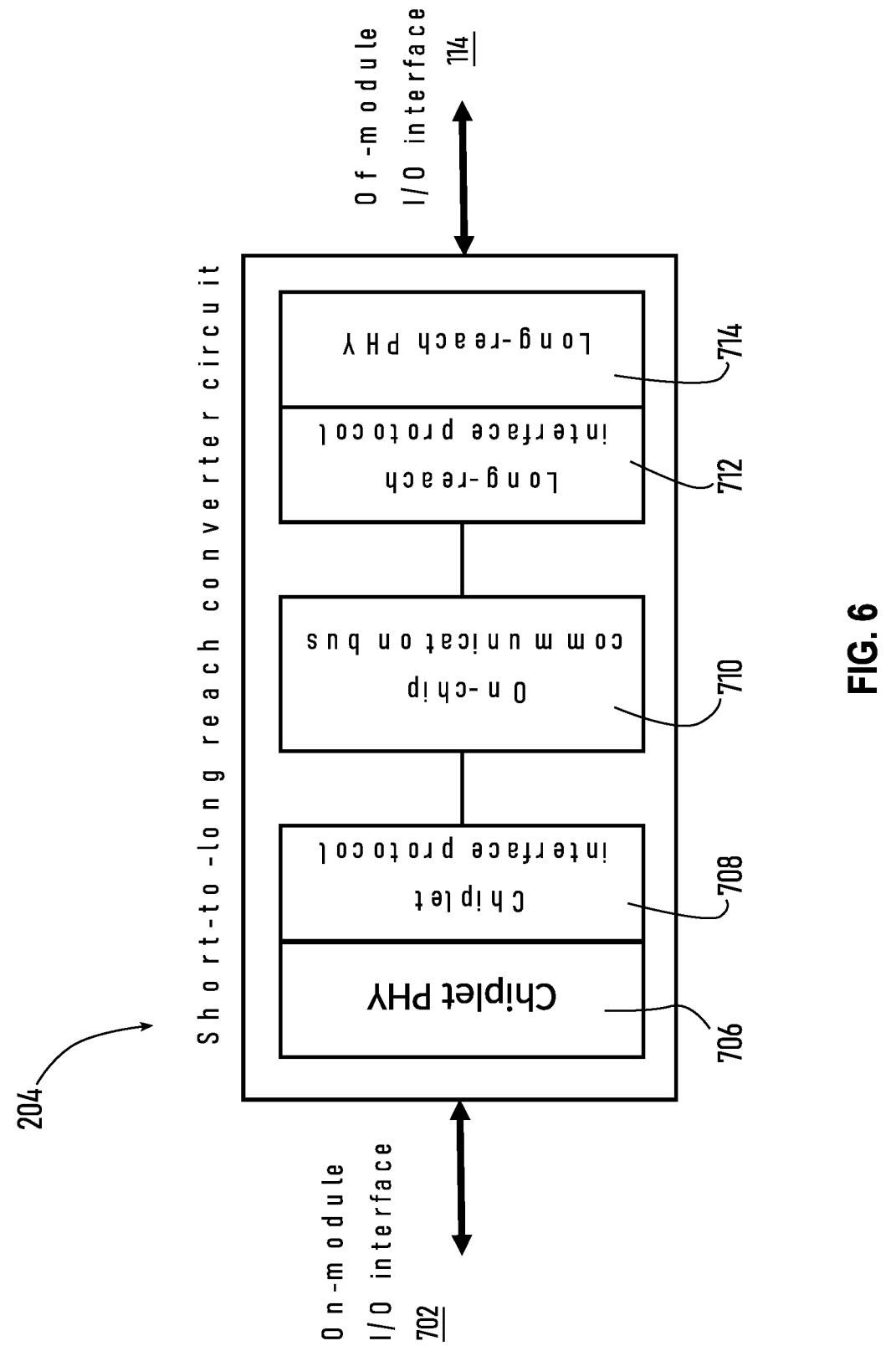
FIG. 6 depicts a short-to-long converter circuit, according to exemplary embodiments.

FIG. 5 depicts a built-in-self-test (BIST) circuit 208 that is usable in either of the active bridges 108 or 308 that are shown in FIG. 1 through FIG. 3. The BIST 208 includes a pattern generator 602, a mode control 604, and a pattern checker 606.

Figure 11:
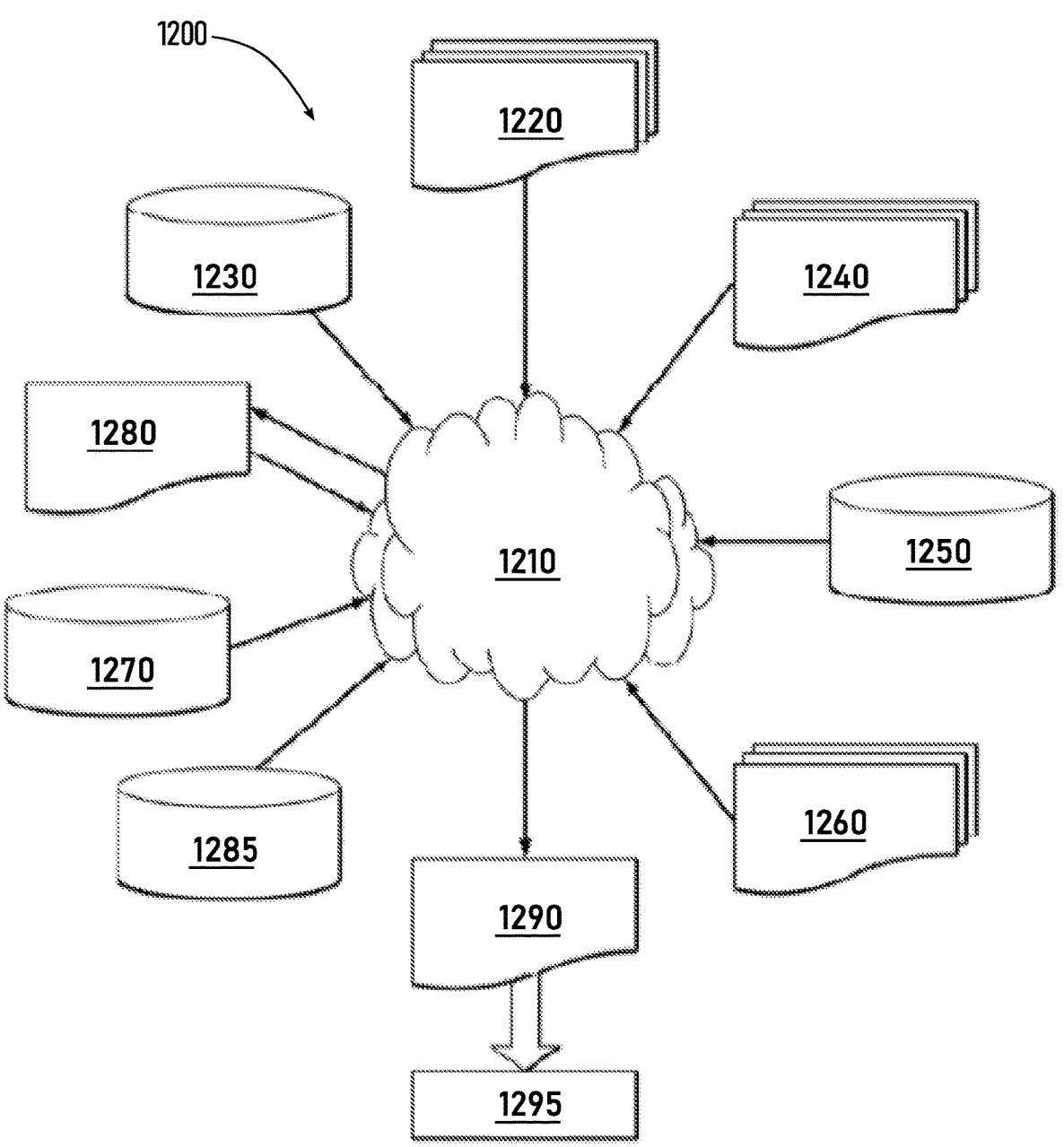
FIG. 11 is a flow diagram of a design process used in semiconductor design, manufacture, and/or test.

In one or more embodiments, the pattern generator 602 is an electronic circuit that is configured to produce a distinctive voltage or current signal, e.g., a particular sequence of high and low logic voltage pulses. The mode control 604 is an electronic circuit that is configured to send a high or low logic signal, which will set a component to be functional or under test; in one or more embodiments, the mode control 604 is connected to multiple components and is configured to send a "test" signal to each component individually or in groups. The pattern checker 606 is configured to receive a signal from a component under test, e.g., a distinctive pattern of high and low logic voltage pulses, and to compare that signal to a database of bit patterns that are stored in non-volatile memory. The pattern generator 602, mode control 604, and pattern checker 606 can be implemented, for example, using digital circuitry. Refer to FIG. 11 and the below discussion of an exemplary design process used in semiconductor design, manufacture, and/or test. For example, use computer-aided design techniques to synthesize logic that implements the described functions of elements 602, 604, 606.

Figure 8:
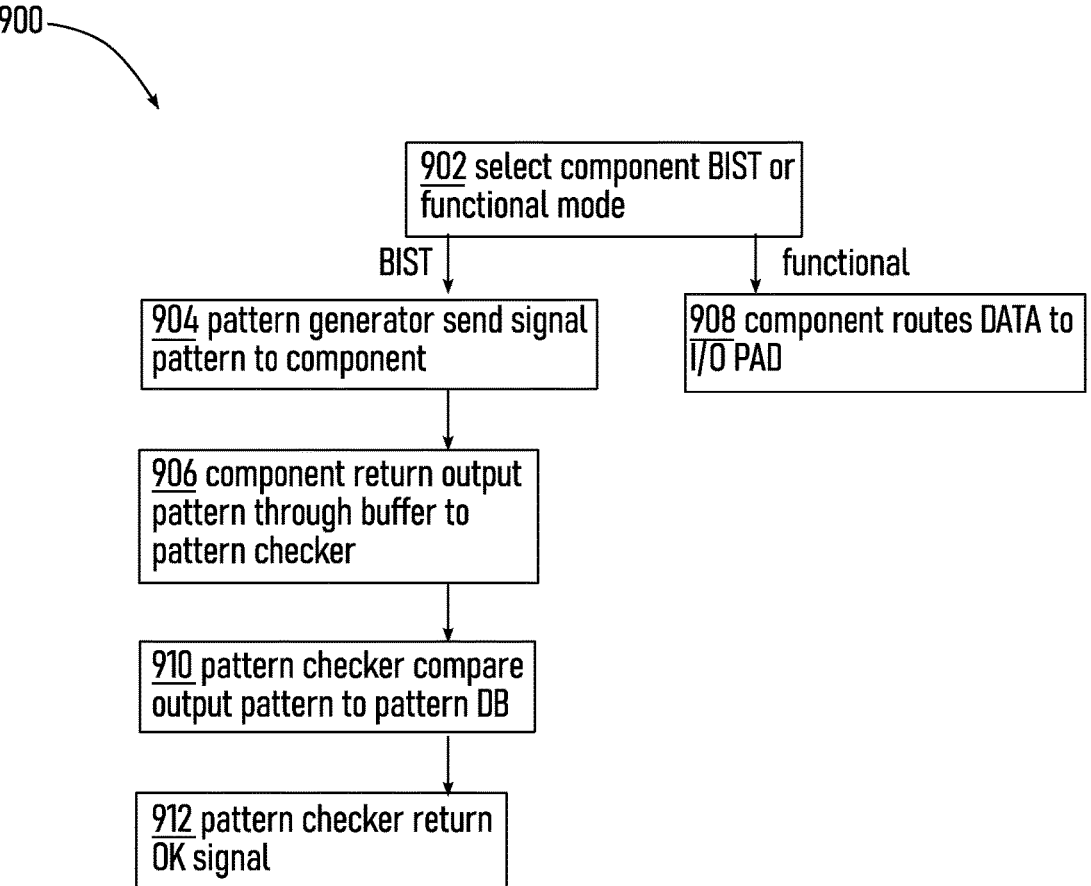
FIG. 8 depicts, in a flowchart, a method of operation of the BIST that is shown in FIG. 5.

In operation, according to a method 900 as shown in FIG. 8, the mode control 604 selects, at 902, whether a component (e.g., a MUX 1002 of the short-to-long analog converter 312) will be in BIST mode or functional mode. In BIST mode, at 904 the pattern generator 602 sends a signal pattern through a buffer 608 to the component under test. At 906, the component returns an output pattern through a buffer 610 and then to the pattern checker 606. In functional mode, at 908 the component routes DATA to an I/O PAD. In BIST mode, at 910, the pattern checker 606 compares the signal returned by the component to a database of signals that should be produced by the component in response to the pattern sent from the pattern generator 602. In case the signal matches the database, then at 912, the BIST 208 returns an OK result for the component.

Figure 9:
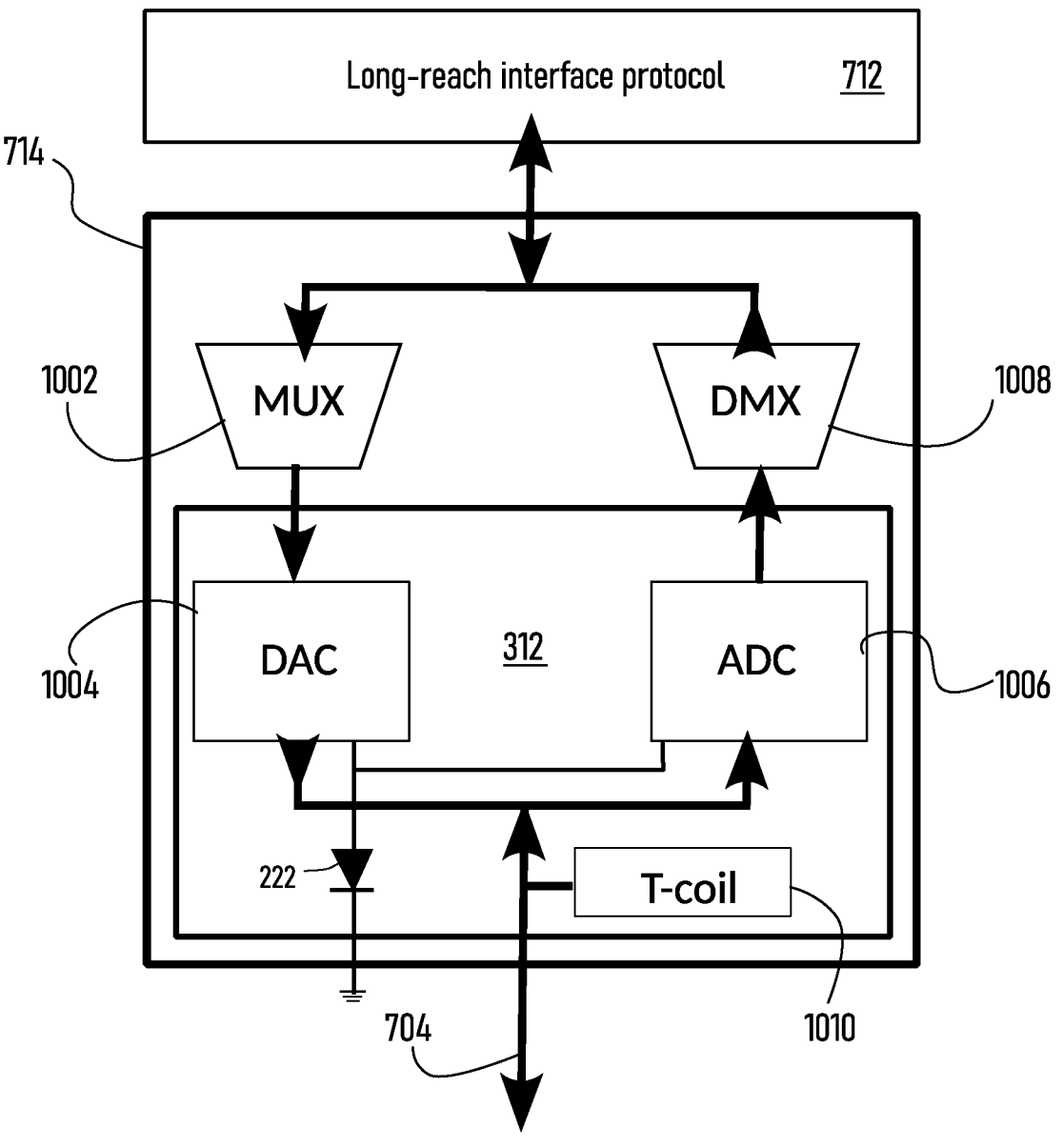
FIG. 9 depicts, in a schematic, details of a long-reach physical layer of the short-to-long converter circuit that is shown in FIG. 6.

FIG. 6 depicts a short-to-long converter circuit 204, according to exemplary embodiments. The circuit 204 is connected between an on-module I/O interface 702 and an off-module I/O interface 114. The circuit 204 includes a chiplet physical (PHY) layer 706, which operates according to a chiplet interface protocol 708. In an on-chip communication bus 710, signals from the chiplet PHY are transferred to a long-reach PHY 714, which operates according to a long-reach interface protocol 712. In one or more embodiments, the protocol 712 is software-implemented. Generally, referring also to FIG. 9, the long-reach PHY 714 includes a multiplexer 1002 and a digital-to-analog converter (DAC) 1004 that are configured to process signals that are outbound from the chiplet, and includes a demultiplexer 1008 and an analog-to-digital converter (ADC) 1006 that are configured to process signals that are inbound to the chiplet. As already mentioned, the long-reach PHY 714 includes the ESD protection diode 222. In one or more embodiments, the long-reach PHY 714 includes a T-coil 1010, which is connected to condition the analog signal at off-module I/O interface 114. Generally, the long-reach PHY 714 includes an analog portion (shown as 312 in, e.g., FIG. 3 and FIG. 3) while the short-reach PHY includes a digital portion (shown as 304 in, e.g., FIG. 3 and FIG. 3).

Given the discussion thus far, it will be appreciated that, in general terms, an exemplary semiconductor integrated circuit device 100 includes: an active bridge 108, 308, or 404; a first chiplet 106, 306, or 402 that is mounted onto the active bridge; a second chiplet 107 or 403 that is mounted onto the active bridge; and a short-to-long converter circuit 204 that includes an analog portion 312 and a digital portion 304. The active bridge includes at least the analog portion 312 of the short-to-long converter circuit 204, which is electrically connected to at least the first chiplet, e.g., 106; and a short-reach physical layer 112 that electrically connects the first chiplet and the second chiplet. The first chiplet includes a first logic core 210; a first chiplet interface 202 that is electrically connected between the first logic core and the short-to-long converter circuit; and a second chiplet interface 207 that is electrically connected between the first logic core and the second chiplet. The second chiplet includes a second logic core 212; and a third chiplet interface 206 that is electrically connected between the second logic core and the second chiplet interface.

In one or more embodiments, the active bridge, e.g., 108, also includes a selector switch 205 that directs signals to one of the short-reach physical layer 112 and the analog portion 312 of the short-to-long converter circuit.

In one or more embodiments, the active bridge also includes both the analog portion of the short-to-long converter circuit 204 and the digital portion of the short-to-long converter circuit 204; and a selector switch 205 that directs signals to one of the short-reach physical layer 112 and the digital portion 304 of the short-to-long converter circuit.

In one or more embodiments, the first chiplet also includes a first digital portion 304 of the short-to-long converter circuit. In one or more embodiments, the second chiplet also includes a second digital portion 304 of the short-to-long converter circuit. The digital portions 304 may include digital load drivers.

In one or more embodiments, the short-to-long converter circuit includes a long-reach physical layer 714, which includes a multiplexer 1002 and a digital-to-analog converter (DAC) 1004 that are configured to process signals that are outbound from the short-reach physical layer 112 through the active bridge; and a demultiplexer 1008 and an analog-to-digital converter (ADC) 1006 that are configured to process signals that are inbound to the short-reach physical layer 112 through the active bridge.

According to another aspect, an exemplary semiconductor integrated circuit device includes an active bridge 108; a first chiplet 106 mounted onto the active bridge; a second chiplet 107 mounted onto the active bridge; and a short-to-long converter circuit 204 that includes an analog portion 312 and a digital portion 304. The active bridge includes at least the analog portion 312 of the short-to-long converter circuit, which is electrically connected to at least the first chiplet 106; a short-reach physical layer 112 that electrically connects the first chiplet and the second chiplet; and a built-in-self-test (BIST) circuit 208 that is connected in communication with at least the analog portion of the short-to-long converter circuit.

In one or more embodiments, the active bridge also includes a selector switch 205 that directs signals to one of the short-reach physical layer 112 and the analog portion 312 of the short-to-long converter circuit.

In one or more embodiments, the active bridge also includes both the analog portion of the short-to-long converter circuit and the digital portion of the short-to-long converter circuit; and a selector switch that directs signals between either the short-reach physical layer or the digital portion of the short-to-long converter circuit.

In one or more embodiments, the first chiplet also includes a first digital portion of the short-to-long converter circuit.

In one or more embodiments, the second chiplet also includes a second digital portion of the short-to-long converter circuit.

In one or more embodiments, the short-to-long converter circuit includes a long-reach physical layer, which includes a multiplexer and a digital-to-analog converter (DAC) for signals that are outbound from the first chiplet through the active bridge; and a demultiplexer and an analog-to-digital converter (ADC) for signals that are inbound to the first chiplet through the active bridge.

In one or more embodiments, the BIST 208 includes a pattern generator 602 that is configured to transmit a signal pattern to a component of the device; a mode controller 604 that is configured to switch the component between a test mode and a functional mode, wherein the component is configured to, in the test mode, process the signal pattern transmitted by the pattern generator, and is configured to, in the functional mode, process data provided from other components of the device; and a pattern checker 606 that is configured to receive from the component an output signal, and is configured to compare the output signal to a signals database and is configured to produce an OK signal in the event that the output signal matches an entry in the signals database that corresponds to the signal pattern transmitted by the pattern generator.

Figure 10:
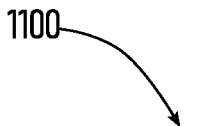
FIG. 10 depicts, in a flowchart, a method of operation of a system that includes one of the active bridges that are shown in FIG. 1 through FIG. 3.
Figure 10:
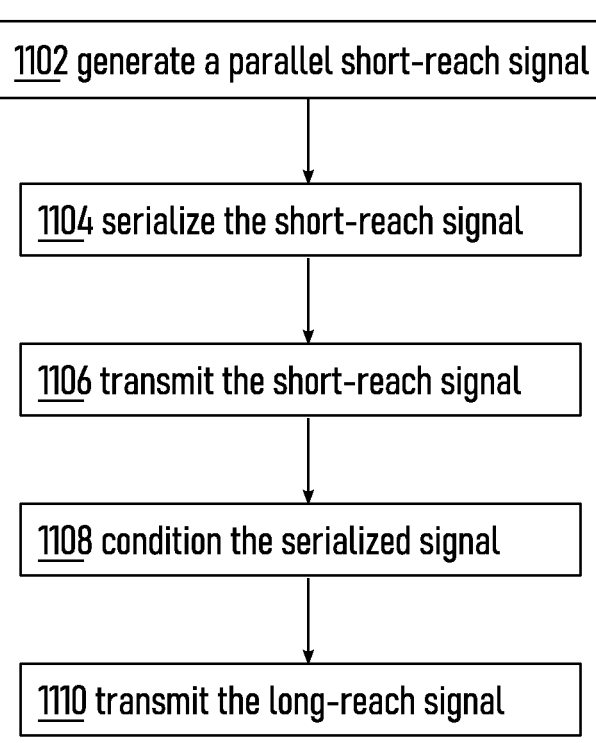

Referring to FIG. 10, another aspect provides a method 1100 that includes, in a semiconductor integrated circuit device that includes two chiplets, a module, a substrate, another module, and an active bridge that is connected between the two chiplets and the module, at 1102, generating a parallel short-reach signal in one of the chiplets; at 1104, serializing the short-reach signal; at 1106, transmitting the short-reach signal from the one of the chiplets to the active bridge; at 1108, conditioning the serialized signal as a long-reach signal; and, at 1110, transmitting the long-reach signal from the active bridge through the module and the substrate to the other module.

In one or more embodiments, serializing the short-reach signal is done in a digital circuit of the one of the chiplets. In one or more embodiments, serializing the short-reach signal is accomplished using a multiplexer of the digital circuit of the one of the chiplets. In one or more embodiments, conditioning the serialized signal as a long-reach signal is done in an analog circuit of the active bridge. In one or more embodiments, conditioning the serialized signal is accomplished using a digital-to-analog converter and a T-coil of the analog circuit of the active bridge.

In one or more embodiments, the method also includes, at 802, activating a mode controller of a built-in-self test circuit (BIST) to set a component of the active bridge to a test mode; at 904, generating a signal pattern in a pattern generator of the BIST and transmitting the signal pattern from the pattern generator to the component in test mode; at 906, receiving from the component in test mode, at a pattern checker of the BIST, an output signal; and, in the pattern checker, at 908, comparing the output signal to a signals database of the BIST. In one or more embodiments, the method also includes the pattern checker producing an OK signal, at 910, in the event that the output signal matches an entry of the signals database that corresponds to the signal pattern that was transmitted from the pattern generator to the component in test mode.

Exemplary Design Process Used in Semiconductor Design, Manufacture, and/or Test One or more embodiments of hardware in accordance with aspects of the invention can be implemented using techniques for semiconductor integrated circuit design simulation, test, layout, and/or manufacture. In this regard, FIG. 11 shows a block diagram of an exemplary design flow 1200 used for example, in semiconductor IC logic design, simulation, test, layout, and manufacture. Design flow 1200 includes processes, machines and/or mechanisms for processing design structures or devices to generate logically or otherwise functionally equivalent representations of design structures and/or devices, such as those disclosed herein or the like. The design structures processed and/or generated by design flow 1200 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a gate array or storage medium or the like, design structure 1220 may be accessed and processed by one or more hardware and/or software modules within design process 1210 to simulate or otherwise functionally represent an electronic component, circuit, electronic or logic module, apparatus, device, or system. As such, design structure 1220 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 1210 preferably employs and incorporates hardware and/or software modules for synthesizing, translating, or otherwise processing a design/simulation functional equivalent of components, circuits, devices, or logic structures to generate a Netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 1210 may include hardware and software modules for processing a variety of input data structure types including Netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on data storage media and that when processed by an ECAD system generate a logically or otherwise functionally equivalent form of one or more IC designs or the like as disclosed herein. In one embodiment, design structure 1290 may comprise a compiled, executable HDL simulation model that functionally simulates the devices disclosed herein.

Design structure 1290 may also employ a data format used for the exchange of layout data of integrated circuits and/or symbolic data format (e.g., information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. Design structure 1290 may then proceed to a stage 1295 where, for example, design structure 1290: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit device that comprises:

an active bridge;

a first chiplet mounted onto the active bridge;

a second chiplet mounted onto the active bridge; and a short-to-long converter circuit that includes an analog portion and a digital portion, wherein the digital portion is disposed in at least one of the first chiplet and the second chiplet;

wherein the active bridge comprises:

at least the analog portion of the short-to-long converter circuit, which is electrically connected to at least the first chiplet; and a short-reach physical layer that electrically connects the first chiplet and the second chiplet;

wherein the first chiplet comprises:

a first logic core;

a first chiplet interface that is electrically connected between the first logic core and the short-to-long converter circuit; and a second chiplet interface that is electrically connected between the first logic core and the second chiplet; and wherein the second chiplet comprises:

a second logic core; and a third chiplet interface that is electrically connected between the second logic core and the second chiplet interface.

2. The device of claim 1, wherein the active bridge further comprises:

a selector switch that directs signals to one of the short-reach physical layer and the analog portion of the short-to-long converter circuit.

3. The device of claim 1, wherein the active bridge further comprises:

both the analog portion of the short-to-long converter circuit and the digital portion of the short-to-long converter circuit; and a selector switch that directs signals to one of the short-reach physical layer and the digital portion of the short-to-long converter circuit.

4. The device of claim 1, wherein the first chiplet further comprises:

a first digital portion of the short-to-long converter circuit.

5. The device of claim 4, wherein the second chiplet further comprises:

a second digital portion of the short-to-long converter circuit.

6. The device of claim 1, wherein the short-to-long converter circuit comprises a long-reach physical layer, which comprises:

a multiplexer and a digital-to-analog converter (DAC), which are configured to process signals that are outbound from the short-reach physical layer through the active bridge; and a demultiplexer and an analog-to-digital converter (ADC), which are configured to process signals that are inbound to the short-reach physical layer through the active bridge.

7. A semiconductor integrated circuit device that comprises:

an active bridge;

a first chiplet mounted onto the active bridge;

a second chiplet mounted onto the active bridge; and a short-to-long converter circuit that includes an analog portion and a digital portion, wherein the digital portion is disposed in at least one of the first chiplet and the second chiplet;

wherein the active bridge comprises:

at least the analog portion of the short-to-long converter circuit, which is electrically connected to at least the first chiplet;

a short-reach physical layer that electrically connects the first chiplet and the second chiplet; and a built-in-self-test (BIST) circuit that is connected in communication with at least the analog portion of the short-to-long converter circuit.

8. The device of claim 7, wherein the active bridge further comprises:

a selector switch that directs signals to one of the short-reach physical layer and the analog portion of the short-to-long converter circuit.

9. The device of claim 7, wherein the active bridge further comprises:

both the analog portion of the short-to-long converter circuit and the digital portion of the short-to-long converter circuit; and a selector switch that directs signals to one of the short-reach physical layer and the digital portion of the short-to-long converter circuit.

10. The device of claim 7, wherein the first chiplet further comprises:

a first digital portion of the short-to-long converter circuit.

11. The device of claim 10, wherein the second chiplet further comprises:

a second digital portion of the short-to-long converter circuit.

12. The device of claim 7, wherein the short-to-long converter circuit comprises a long-reach physical layer, which comprises:

a multiplexer and a digital-to-analog converter (DAC), which are configured to process signals that are outbound from the short-reach physical layer through the active bridge; and a demultiplexer and an analog-to-digital converter (ADC), which are configured to process signals that are inbound to the short-reach physical layer through the active bridge.

13. The device of claim 7, wherein the BIST comprises:

a pattern generator that is configured to transmit a signal pattern to a component of the device;

a mode controller that is configured to switch the component between a test mode and a functional mode, wherein the component is configured to, in the test mode, process the signal pattern transmitted by the pattern generator, and is configured to, in the functional mode, process data provided from other components of the device; and a pattern checker that is configured to receive from the component an output signal, and is configured to compare the output signal to a signals database and is configured to produce an OK signal in the event that the output signal matches an entry in the signals database that corresponds to the signal pattern transmitted by the pattern generator.

14. A method that comprises, in a semiconductor integrated circuit device that comprises two chiplets, a first module, a substrate, a second module, and an active bridge that is connected between the two chiplets and the first module:

generating a parallel short-reach signal in one of the chiplets;

serializing the short-reach signal;

transmitting the short-reach signal from the one of the chiplets to the active bridge;

conditioning the serialized signal as a long-reach signal; and transmitting the long-reach signal from the active bridge through the first module and the substrate to the second module.

15. The method of claim 14, wherein serializing the short-reach signal is done in a digital circuit of the one of the chiplets, the digital circuit implementing a digital portion of a short-to-long converter circuit.

16. The method of claim 15, wherein serializing the short-reach signal is accomplished using a multiplexer of the digital circuit of the one of the chiplets.

17. The method of claim 14, wherein conditioning the serialized signal as the long-reach signal is done in an analog circuit of the active bridge, the analog circuit implementing an analog portion of a short-to-long converter circuit.

18. The method of claim 17, wherein conditioning the serialized signal is accomplished using a digital-to-analog converter and a T-coil of the analog circuit of the active bridge.

19. The method of claim 14, further comprising:

activating a mode controller of a built-in-self test circuit (BIST) to set a component of the active bridge to a test mode;

generating a signal pattern in a pattern generator of the BIST;

transmitting the signal pattern from the pattern generator to the component in test mode;

receiving from the component in test mode, at a pattern checker of the BIST, an output signal; and, in the pattern checker, comparing the output signal to a signals database of the BIST.

20. The method of claim 19, further comprising:

the pattern checker producing an OK signal in the event that the output signal matches an entry of the signals database that corresponds to the signal pattern that was transmitted from the pattern generator to the component in test mode.

* * * * *